(12) United States Patent
Vilas-Boas

(10) Patent No.: US 6,637,564 B1
(45) Date of Patent: Oct. 28, 2003

(54) CURRENT DETECTOR WITH TWO MOUNTING POSITIONS

(75) Inventor: Armando Vilas-Boas, Saint Priest (FR)

(73) Assignee: ABB Control, Chassieu (FR)

(*) Notice: Subject to any disclaimer, the term of this patent is extended or adjusted under 35 U.S.C. 154(b) by 0 days.

(21) Appl. No.: 09/979,062
(22) PCT Filed: May 19, 2000
(86) PCT No.: PCT/FR00/01360
§ 371 (c)(1),
(2), (4) Date: Nov. 19, 2001
(87) PCT Pub. No.: WO00/72339
PCT Pub. Date: Nov. 30, 2000

(30) Foreign Application Priority Data

May 21, 1999 (FR) .............................. 99 06488

(51) Int. Cl.⁷ ................................ B60M 1/00
(52) U.S. Cl. .................................... 191/22 R
(58) Field of Search ............... 191/45, 46, 47, 191/49, 22 R, 23 R, 30

(56) References Cited

U.S. PATENT DOCUMENTS 881,531 A * 3/1908 Baukat .................. 191/45 R
5,669,472 A * 9/1997 Azzouni ................. 191/49
5,673,774 A * 10/1997 Trapp et al. ............ 191/49

FOREIGN PATENT DOCUMENTS

FR 1.116.512 5/1956

\* cited by examiner

Primary Examiner—S. Joseph Morano
Assistant Examiner—Robert J. McCarry, Jr.
(74) Attorney, Agent, or Firm—Young & Thompson

(57) ABSTRACT

A current detector can be fixed in an upright position or in a flat position on top of the surface of a support. The detector includes a housing which is provided with a first series of passages for fixing screws, whereby the axes thereof are perpendicular to a large surface of the housing for fixation on top of the surface of a support. The housing is provided with a second set of passages for fixing screws, whereby the axes thereof are perpendicular to those of the first set of passages for the screws which are provided for fixation of the housing in an upright position on the surface of the support. At least one, preferably two, auxiliary flange mounting elements are placed adjacent to the housing and are mounted thereon, being provided with a complimentary shape for the sole purpose of fixing the housing in an upright position on the surface of the support and wherein the second set of passages for the screws is formed.

11 Claims, 5 Drawing Sheets

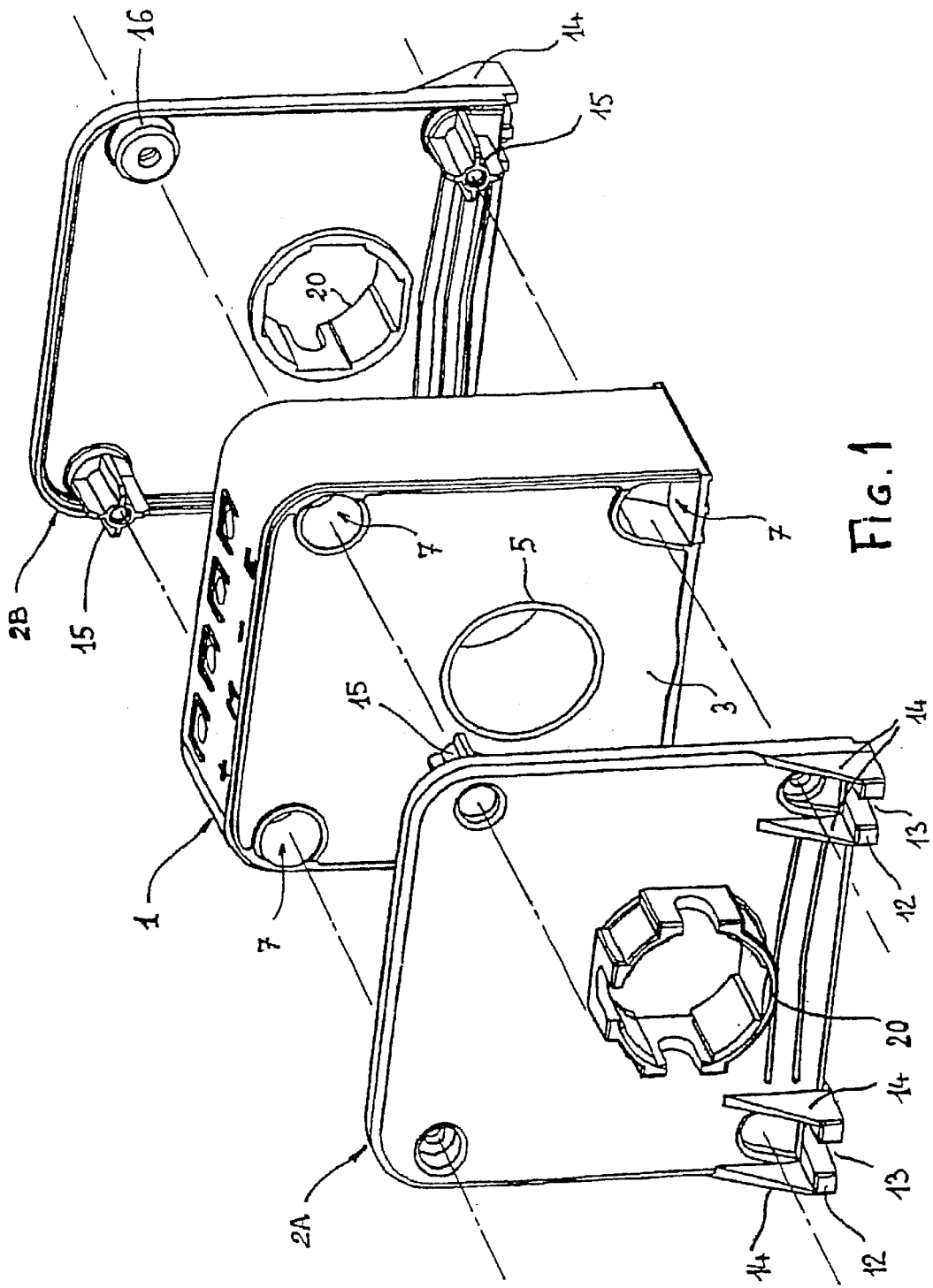

CURRENT DETECTOR WITH TWO MOUNTING POSITIONS

The present invention relates to a current pickup shoe that can be fixed either upright or lying flat against a support surface, of the type comprising a housing which has a first set of passages for fixation screws, whose axes are perpendicular to a large surface of the housing for its securement flat against the support surface, a second set of passages for fixation screws, whose axes are perpendicular to those of the first set of screw passages, being provided for the securement of the housing upright on said support surface.

In known current pickup shoes of this type, the passages for the screws are conventionally constituted by notches or circular holes pierced in securement tongues formed of one piece with the housing of the pickup shoe and projecting from different sides of the latter. The notches or circular holes which constitute the first set of screw passages are usually formed in a first set of securement tongues which are located in a first plane, whilst the notches or circular holes constituting the second set of screw passages are formed in a second set of securement tongues, which are located in a second plane perpendicular to the first plane.

Current pickup shoes of this type have the advantage of being able to be mounted in one or the other of two different positions on the support surface. On the other hand, when the current pickup shoe is mounted on the support surface, the unused securement tongues increase the size of the current pickup shoe. This can constitute a difficulty for integrating the current pickup shoe into systems requiring a certain compactness.

Moreover, there are known current pickup shoes whose housing permits only a single mounting position (upright or recumbent). These latter current pickup shoes are generally of less size than the current pickup shoes with two manners or positions for mounting. On the other hand, when a user desires to have the possibility of integrating a current pickup shoe into various systems either in the upright position or in the recumbent position, as a function of needs, he must thus have in stock two types of current pickup shoes. This complicates the management of stocks and the maintenance, and also increases the cost of the stock.

The present invention thus has for its object to overcome this drawback, by providing a current pickup shoe which can be mounted as desired upright or recumbent, and which is particularly compact, in particular when it is recumbent.

To this end, the current pickup shoe according to the invention is characterized in that it comprises moreover at least one auxiliary flange element which is secured to the housing and assembled with it with shape mating only in the securement of the housing upright on the support surface, and in which is formed said second set of screw passages.

Under these conditions, when the current pickup shoe is mounted recumbent on the support surface, which is to say without the auxiliary flange element, no securement tongue that is not used projects from the housing of the pickup shoe, so that the latter is very compact. On the other hand, when the current pickup shoe is mounted in the upright position, only the securement tongues which are necessary for this method of mounting project from the housing, such that, here again, the current pickup shoe remains relatively compact. The user can thus choose to assemble or not the auxiliary flange element of the housing of the pickup shoe as a function of need, of stock control, and of maintenance. Even if, to have this choice, the user must have in stock two separate pieces, namely, on the one hand, the current pickup shoe and on the other hand the auxiliary flange element, this latter member is usually a much less costly piece than the current pickup shoe itself. As a result, the cost of the stock is reduced relative to the case where the user had to have two different types of current pickup shoe each for a single mounting position.

The current pickup shoe according to the invention can moreover have the following characteristics:

- the auxiliary flange element is constituted by a flange having an internal surface which is applied against a large surface of the housing of the current pickup shoe, and an external surface which carries, on one edge, two spaced securement tongues which extend at a right angle outwardly relative to said external surface and in each of which is formed one of said screw passages of the second set;
- with each securement tongue of the flange are associated two triangular reinforcing gussets, which are disposed on opposite sides of the corresponding screw passage of the securement tongue;
- the internal surface of the flange has at least two tenons which are designed to enter, with a small play, each into one of the screw passages of the first set of screw passages of the housing;
- said large surface of the housing against which the flange is applied, has a rectangular shape, said first set of screw passages comprises four passages located at the corners of said large surface, and the internal surface of said flange has four tenons each receivable in a respective passage of the housing;
- in a preferred embodiment of the invention, the current pickup shoe comprises two auxiliary flange elements in the form of two flanges which are applied respectively against the opposite large surfaces of the housing;
- the two flanges can thus be constituted by identical molded pieces;
- two of the four tenons of each flange have a shouldered cylindrical hole, whose larger diameter part opens on the side of the external surface of the flange and forms a recess for the head of a self-tapping screw, and the two remaining tenons of each flange have a cylindrical fore-hole in which can be screwed a self-tapping screw whose head is located in the portion forming a recess of the shouldered hole and one of the two tenons with shouldered hole of the opposite flange;
- each screw passage of the first set of screw passages is constituted by a well which passes through the housing from one large surface to the other and which has at its middle a partition which is pierced with a hole for the passage of the rod of the shank of a securement screw;
- as is usual, the housing comprises a passage opening for a primary conductor through which an electric current to be measured flows; the flange or flanges comprise thus an opening which, when the flange is secured to the housing, coincides with the opening of the housing, and a collar which is formed of a single piece with the flange, on its external surface, and which surrounds the opening of the flange to support said primary conductor;
- in another embodiment of the invention, said auxiliary flange element is constituted by an arch which surrounds the housing on three sides of the latter and of which each leg is provided, at its end, with a securement tongue in which is formed one of the passages for the screws of said second set of screw passages.

The invention also relates to a flange for a current pickup shoe, said flange being characterized in that it is shaped to be assembled shape-matingly to the housing of said current pickup shoe for the securement of said housing upright on said support surface, and in that said second set of screw passages is formed in said flang.

Other characteristics and advantages of the invention will become apparent from the following description, given by way of example, with reference to the accompanying drawings, in which:

FIG. 1 is an exploded perspective view showing a current pickup shoe according to a first embodiment of the invention;

Figure 2:
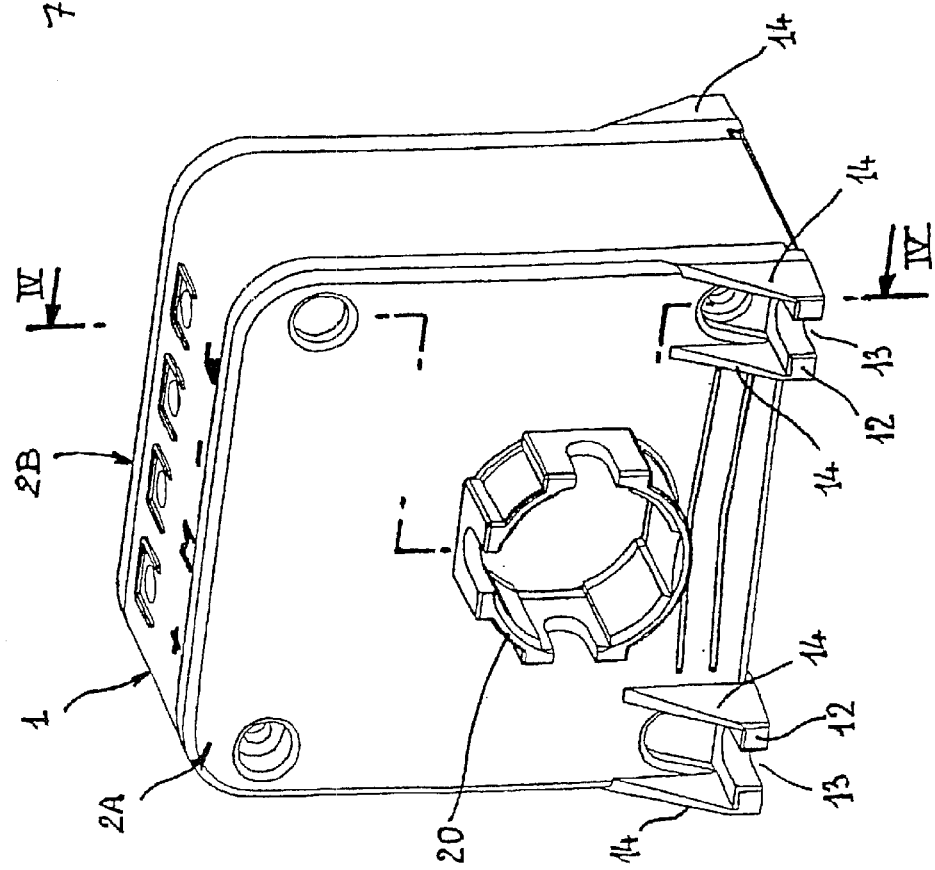
FIG. 2 is a perspective view of the current pickup shoe of FIG. 1, in the assembled condition, which is to say in its configuration for upright mounting.

Referring first to FIGS. 1 and 2, it will be seen that the current pickup shoe according to the invention comprises a housing 1 and two flanges 2A and 2B permitting securing the housing 1 in an upright position on a support surface (not shown). The two flanges 2A and 2B are shown in the detached condition from the housing 1 in FIG. 1 and in the assembled condition with the housing 1 in FIG. 2.

Figure 3:
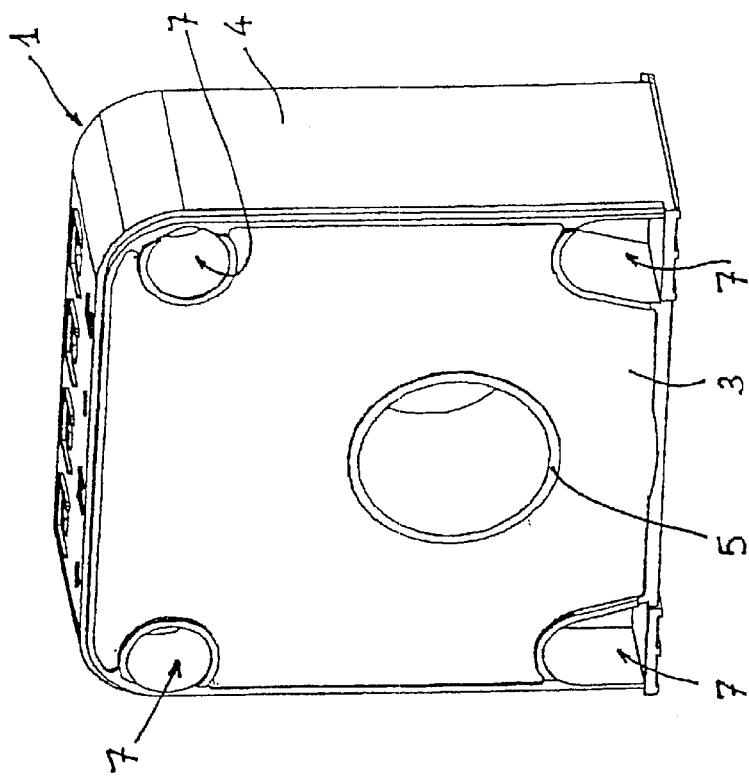
FIG. 3 is a perspective view of the current pickup shoe of FIG. 1, without the auxiliary flanges, which is to say in its configuration for recumbent mounting.

The housing 1 overall has a parallelepipedal shape as shown in FIG. 3. It is constituted by a housing body having a rear wall 3 which, in the illustrated example, has an approximately square or slightly rectangular shape, with two rounded corners, and a peripheral wall 4, which surrounds the rear wall 3 on its four sides. The rear wall 3 forms one of the two large parallel and substantially flat surfaces of the housing 1, the other large surface not being visible in FIG. 3. A cylindrical sleeve 5, whose axis is perpendicular to the rear wall 3, is formed of a single piece with this latter, substantially in the middle of the latter or in a slightly eccentric position relative to its middle, as shown in FIG. 3. The cylindrical sleeve 5 extends from the rear wall 3 to the other large surface of the housing 1 and, in service, it usually surrounds a conductor or an omnibus bar (primary conductor) through which an electric current to be measured flows.

The housing 1 thus constituted usually contains functional elements of the current pickup shoe, namely, an annular magnetic circuit, which carries a measuring winding (secondary winding) and which is disposed about the cylindrical sleeve 5, as well as an electronic measuring circuit, which is carried for example by a printed circuit card and which is connected to the mentioned winding. The magnetic circuit and its winding as well as the electronic circuit can be made in a conventional manner and, as they are not necessary for understanding the invention, they will therefore not be described in detail.

Figure 4:
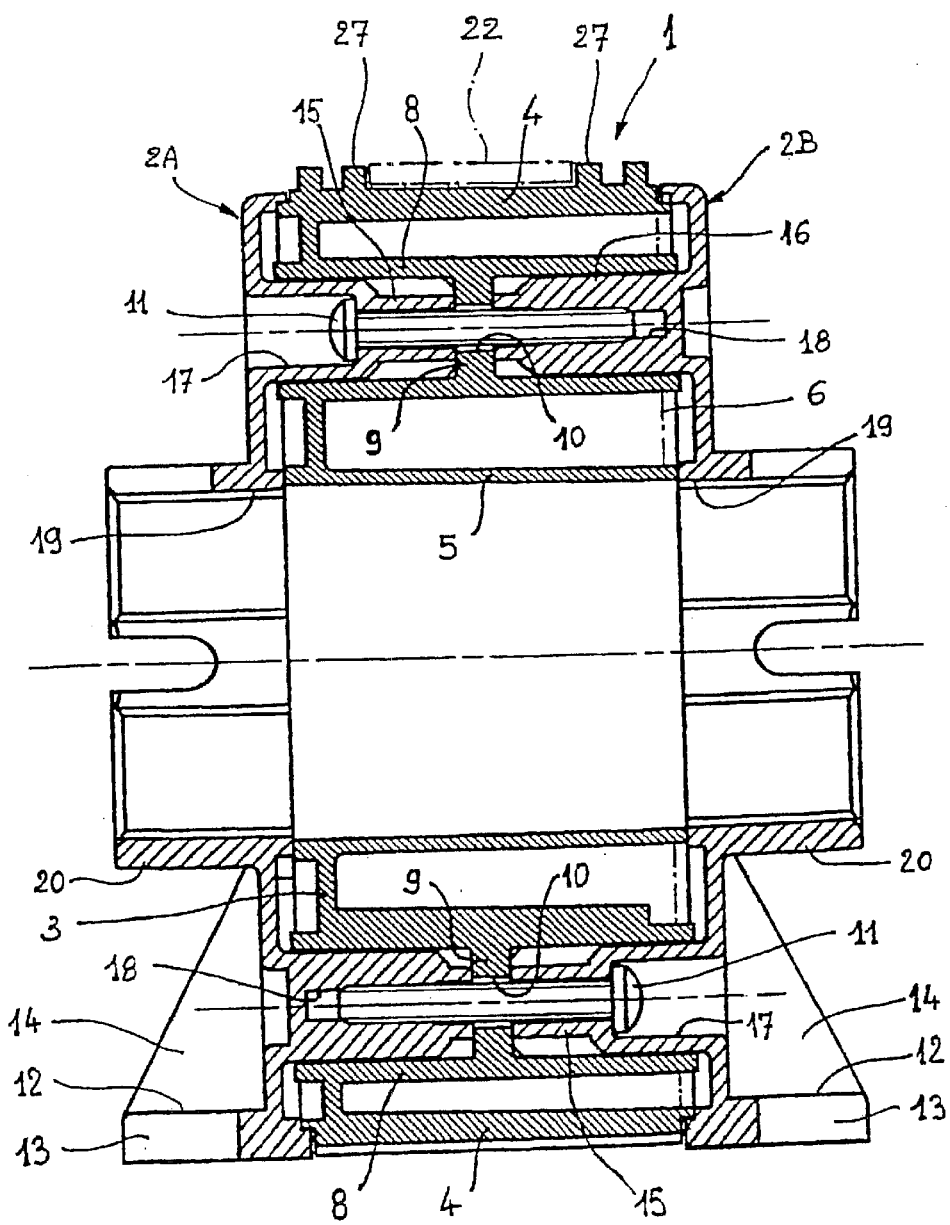
FIG. 4 is a vertical cross-sectional view of the current pickup shoe, in the assembled condition of FIG. 2, the plane of the drawing passing through two vertically aligned screw passages and being offset so as to pass also through the central passage opening of the primary conductor, as indicated by the broken line IV—IV in FIG. 2.

The body of the housing 1 containing the functional elements indicated above, of the current pickup shoe, can be closed by a cover (not shown) or, more simply, after emplacement of said functional elements in the body of the housing, the empty spaces of this latter can be filled with a resin which, after hardening, forms the other large surface of the housing 1, shown in broken lines at 6 in FIG. 4.

As shown in FIG. 3, the housing 1 comprises four passages 7 for securement screws. The passages 7 have axes parallel to the axis of the cylindrical sleeve 5 and are located in the region of the corners of the rear wall 3. As is more particularly shown in FIG. 4, each passage 7 can be constituted by a well 8, which is formed of a single piece with the rear wall 3 and which passes through the housing 1 from one large surface to the other of the latter. Each well 8 has, in its middle, a partition 9 which is pierced by a hole 10, whose diameter is a bit larger than that of the shank of a securement screw 11.

The housing 1 described above, which contains the functional elements of the current pickup shoe, can be fixed in recumbent position on a surface of the support (not shown), which is to say with its two large surfaces 3 and 6 parallel to the support surface. In this case, the two flanges 2A and 2B are not used and the securement screws 11 are engaged in the passages 7, from a same side of the housing 1, then pass through the holes 10 of the partitions 9 and are screwed into suitable tapped holes provided in the support surface. In this case, the heads of the screws 11 come to bear against one of the surfaces of the partitions 9 to press the housing 1 against the support surface.

The two flanges 2A and 2B are used solely when the current pickup shoe must be mounted in the upright position on a support surface. The two flanges 2A and 2B are constituted preferably by identical molded pieces. In the example shown here, each flange 2A, 2B has a square or slightly rectangular shape matching the shape of the contour of the housing 1 or of its rear wall 3.

The external surface of each flange 2A, 2B, which is to say the surface which turns its back to the housing 1, carries, on one edge, two spaced securement tongues 12 which extend at a right angle outwardly relative to said external surface.

In each tongue 12 is formed a notch 13 adapted to receive a securement screw (not shown) permitting the securement of the flange 2A or 2B in the upright position on a support surface. Instead of notches 13, there could of course be provided circular holes or oblong holes. Preferably, each securement tongue 12 is reinforced by two triangular gussets 14, which are disposed on opposite sides of the notch 13.

The internal surface of each flange 2A, 2B, which is to say the surface which is oriented toward the housing, has at least two tenons 15, 16, preferably two pairs of tenons 15, 16, which are positioned and dimensioned to be received with slight play each in one of the passages 7 of the housing 1.

The two tenons 15 of each flange 2A, 2B are located in the corners of the flange corresponding to a first diagonal of square shape or rectangular shape of the flange, whilst the two other tenons 16 are located in the corners of the flange corresponding to the second diagonal of its square or rectangular shape. Under these circumstances, when the two flanges 2A and 2B are applied respectively against the large opposite surfaces of the housing 1 and their tenons 15, 16 are engaged in the passages 7 of the housing, each tenon 15 of the flange 2A or 2B is aligned with the tenon 16 of the flange 2B or 2A in the corresponding passage 7, as shown in FIG. 4.

Each tenon 15 has a cylindrical shouldered hole 17, whose larger diameter portion opens on the side of the external surface of the flange 2A and 2B and forms a recess for the head of one of the securement screws 11. On the other hand, each tenon 16 of each flange 2A or 2B has a cylindrical hole 18 into which can be screwed the screw-threaded shank of one of the securement screws 11. Although the hole 15 could be an internally screw-threaded hole, it is simpler and more economical to provide holes 18 in the form of smooth cylindrical holes and to use self-capping screws as the securement screws 11.

Preferably, the tenons 15 and 16 have lengths such that their front ends come into bearing against the opposite surfaces of the partitions 9 in the wells 8 of the housing 1 after they have been engaged in said wells and that the screws 11 have been screwed down into the holes 18 of the tenons 16.

Once the two flanges 2A and 2B have thus been assembled to the housing 1, there is obtained a current pickup shoe assembly, which is particularly rigid and which can be mounted upright on a support surface (not shown), by placing the securement tongues 12 against support surface and by positioning their notches 13 facing suitable holes provided in the support surface. The current detector assembly (housing 1+flanges 2A and 2B) can then be fixed to the support surface with the help of suitable screws passing through the notches 13 and into the above-mentioned holes in the support surface.

Of course, each flange 2A, 2B comprises a passage opening 19 for the primary conductor through which the current to be measured passes, this opening 19 being aligned with the cylindrical sleeve 5 of the housing 1, as is clearly visible in FIG. 4. In the case in which the current pickup shoe must be able to guide and support a bus bar (not shown) serving as a primary conductor, each flange 2A, 2B can preferably comprise a collet 20, which is formed from a single piece with the flange, or on its external surface, about the opening 19.

In the embodiment which has been described above, there are utilized two flanges 2A and 2B for the securement of the current pickup shoe in an upright position on a support surface. Such an embodiment is particularly suitable when the current pickup shoe is adapted to be subjected, in service, to vibrations or other forces, static or dynamic, which can reach substantial values.

However, the invention is not limited to such an embodiment. Thus, if the flange 2A or 2B is made of a sufficiently rigid plastic material, perhaps reinforced with material such as fibers, and/or if the current pickup shoe is not subjected in service to vibrations or other large static or dynamic forces, a single flange 2A or 2B can suffice for mounting in upright position the current pickup shoe. This case is shown in FIG. 5, in which the elements which are identical or which play the same role as the elements of the embodiment described above, are designated by the same reference numerals and will not again be described in detail.

Figure 5:
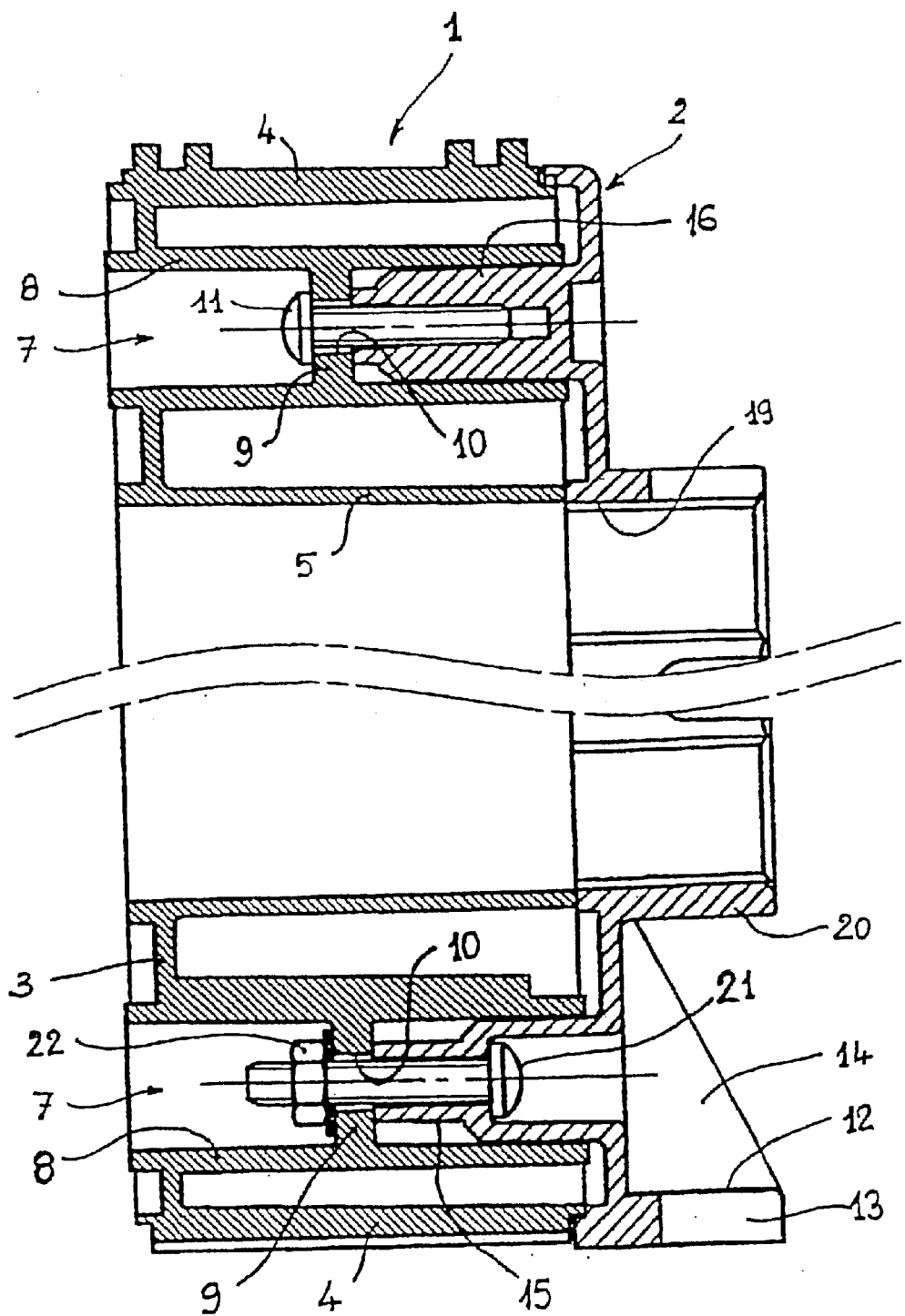
FIG. 5 is a view similar to FIG. 4, showing a modified embodiment using only a single flange for mounting of the current pickup shoe, FIG. 5 showing moreover in its lower and upper portions, respectively, a first and a second type of screw usable for securing the flange to the housing of the pickup shoe.

In the modified embodiment of FIG. 5, the single flange 2 can again have on its internal surface four tenons, namely two tenons 15 and two tenons 16. In this case, each tenon 15 is fixed to the transverse wall 9 of the well 8 corresponding to the housing 1 by a screw and nut assembly 21, 22, whilst each tenon 16 is fixed to the corresponding transverse partition 9 by a self-tapping screw 11 similar to that of the preceding embodiment, but shorter.

In another modified embodiment, to avoid having to use screws 11 and 21 of different types, the four tenons of the flange 2 could be identical. In this case, the four tenons can be similar or identical to the tenons 15 shown in the lower portion of FIG. 5, or else to the tenons 16 shown in the upper portion of FIG. 5.

Figure 6:
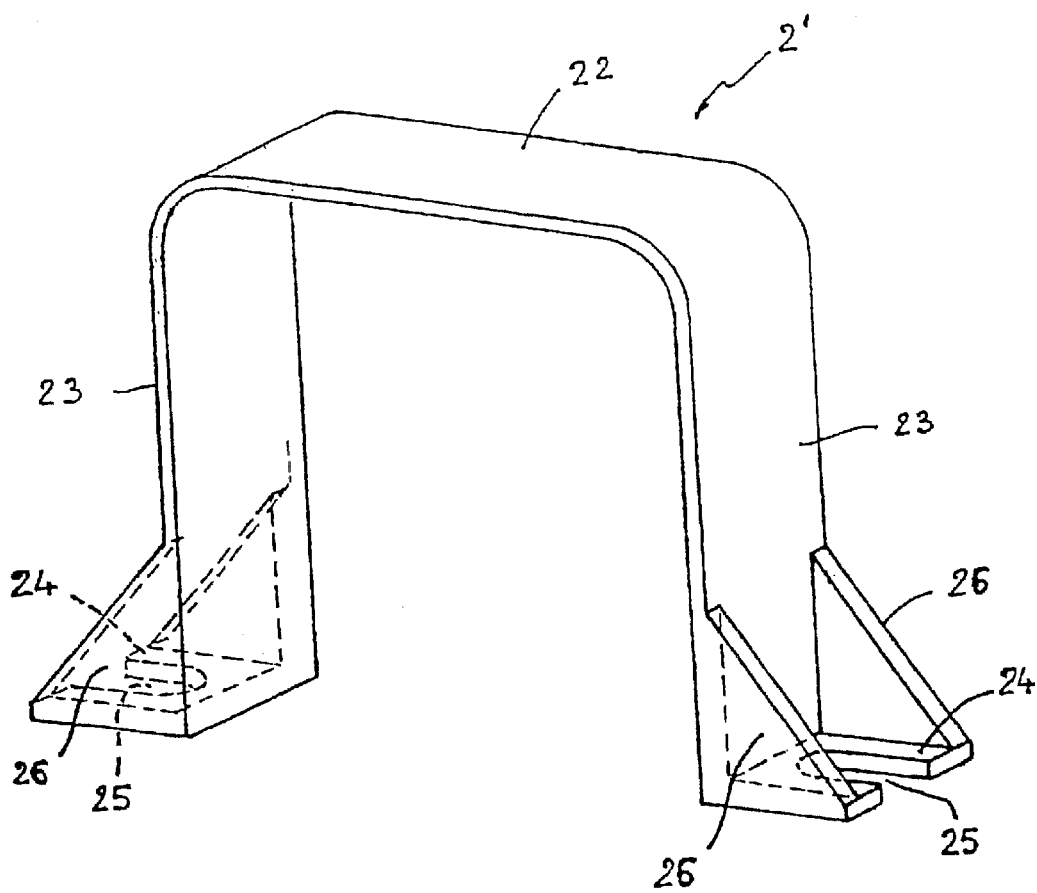
FIG. 6 is a perspective view showing another embodiment of an auxiliary flange element usable to secure the housing of the current pickup shoe in the upright position, to a support surface.

FIG. 6 shows another embodiment of an auxiliary flange element 2' which can be used in the place of the flange 2 of FIG. 5 or the two flanges 2A and 2B of FIGS. 1, 2 and 4, for mounting in upright position the housing 1 of FIG. 3 on a support surface. The auxiliary flange element 2' shown in FIG. 6 is in the form of an arch 22 shaped so as to surround tightly the housing 1 of FIG. 3, on three sides of this housing. Each leg 23 of the arch 22 is provided, at its lower end, with a securement tongue 24 having a passage opening 25 for a securement screw (not shown). The opening 25 shown here is constituted by a notch, but it could also of course be constituted by a circular or oblong hole. Each securement tongue 25 can preferably be reinforced by two triangular gussets 26.

In the case in which the peripheral wall 4 of the housing 1 has ribs 27 as shown in FIG. 4, the width of the arch 22 can be selected so as to correspond to the spacing of the ribs 27. In this case, the arch 22 can coact with the ribs 27 to prevent any movement of the housing 1 in a direction parallel to the axis of the cylindrical sleeve 5, even if the arch 22 is not perfectly locked against the peripheral wall 4 of the housing.

It follows that the embodiments of the invention that have been described above have been given purely by way of indicative example and in no way limiting, and that numerous modifications can be introduced by one skilled in the art without thereby departing from the scope of the invention. Thus the four tenons of the two flanges 2A and 2B could be similar to the tenons 15 described above. In this case, the two flanges 2A and 2B could be assembled to the housing 1 by nut and bolt assemblies similar to that which is shown at the bottom of FIG. 5, the bolts being however longer than what is shown in this figure.

In another modification, the securement of the flange or flanges to the housing could be of the snap-in type. For example, in the case in which there are provided two flanges, two of the four tenons of each flange could be in the form of male tenons provided with snap-in lugs that can engage behind an annular shoulder in a cylindrical shouldered hole formed in each of the two other tenons, such as hole 17 of the tenons 15 described above.

What is claimed is:

1. A current detector that can be aligned in two orthogonal directions, the current detector comprising:

a housing for a detector, said housing having a first surface for placement on a support surface and a second surface for alternative placement on a support surface, said first and second surfaces being orthogonal to each other, said first surface having a current detection opening therethrough for receiving a conductor whose current is to be detected, said housing having a first set of passages whose axes are perpendicular to said first surface and that are arranged to receive devices for securing said first surface to a support surface; and an auxiliary flange removably secured to said housing and having a second set of passages whose axes are perpendicular to said second surface and that are arranged to receive devices for securing said auxiliary flange to a support surface to hold said second surface on the support surface.

2. The current detector of claim 1, wherein said auxiliary flange comprises a first plate abutting said first surface of said housing, said first plate having a first opening corresponding to said current detection opening and at least one tenon that is received in one of said first set of passages for holding said first plate to said first surface.

3. The current detector of claim 2, wherein said first plate comprises a tongue that extends perpendicular to said first plate and through which extends one of said second set of passages.

4. The current detector of claim 2, wherein said auxiliary flange further comprises a second plate abutting a third surface of said housing opposite said first surface, said second plate having a second opening corresponding to said current detection opening and at least one tenon that is received in one of said first set of passages for holding said second plate to said third surface.

5. The current detector of claim 2, further comprising a securement device that extends through said at least one tenon and the respective one of said first set of passages for securing said first plate to said first surface.

6. The current detector of claim 1, wherein said housing is a hollow box with two generally rectangular opposing faces and four sides that are each smaller than said two faces, and said first surface is one of said generally rectangular faces and said second surface is one of said four sides.

7. The current detector of claim 6, wherein said auxiliary flange comprises a first generally rectangular plate abutting said one of said generally rectangular faces, wherein said first set of passages are at corners of said one of said generally rectangular faces, and wherein said first plate has a first opening corresponding to said current detection opening and at least two tenons that are received in respective ones of said first set of passages for holding said first plate to said one of said generally rectangular faces.

8. The current detector of claim 7, wherein said auxiliary flange further comprises a second generally rectangular plate abutting the other of said generally rectangular faces, wherein said first set of passages are at corners of said other of said generally rectangular faces, and wherein said second generally rectangular plate has a second opening corresponding to said current detection opening and at least two tenons that are received in respective ones of said first set of passages for holding said second plate to said other of said generally rectangular faces.

9. The current detector of claim 1, wherein said auxiliary flange comprises an arch around a portion of a periphery of said housing.

10. The current detector of claim 9, wherein said housing is a hollow box with two generally rectangular opposing faces and four sides that are each smaller than said two faces, wherein said first surface is one of said generally rectangular faces and said second surface is one of said four sides, and wherein said arch extends around three of said four sides.

11. The current detector of claim 9, wherein said arch comprises a tongue that extends parallel to said second surface and through which extends one of said second set of passages.

* * * * *